US012749242B2

(12) United States Patent
Sato et al.

(10) Patent No.: US 12,749,242 B2
(45) Date of Patent: Sep. 29, 2026

(54) MAGNETIC RESONANCE IMAGING APPARATUS AND IMAGE PROCESSING METHOD

(71) Applicant: FUJIFILM Healthcare Corporation, Kashiwa (JP)

(72) Inventors: Yoshitaka Sato, Chiba (JP); Yasuhiro Kamada, Chiba (JP); Taisei Ueda, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 335 days.

(21) Appl. No.: 18/660,865

(22) Filed: May 10, 2024

(65) Prior Publication Data

US 2024/0428475 A1 Dec. 26, 2024

(30) Foreign Application Priority Data

Jun. 23, 2023 (JP) ................................ 2023-103642

(51) Int. Cl.

| | |
|---|---|
| ***G06T 12/10*** | (2026.01) |
| ***G01R 33/56*** | (2006.01) |
| ***G01R 33/565*** | (2006.01) |
| ***G06T 5/50*** | (2006.01) |
| ***G06T 12/30*** | (2026.01) |

(52) U.S. Cl.
CPC .......... *G06T 12/10* (2026.01); *G01R 33/5608* (2013.01); *G01R 33/56563* (2013.01); *G06T 5/50* (2013.01); *G06T 12/30* (2026.01); *G06T 2207/10088* (2013.01); *G06T 2207/20212* (2013.01); *G06T 2210/41* (2013.01)

(58) Field of Classification Search
CPC ........... G06T 12/01; G06T 12/30; G06T 5/50; G06T 2207/10088; G06T 2207/20212; G06T 2210/41; G01R 33/5608; G01R 33/56563
See application file for complete search history.

(56) References Cited

U.S. PATENT DOCUMENTS

| | | | | |
|---|---|---|---|---|
| 7,821,264 B2 | 10/2010 | Koch et al. | |
| 9,535,146 B2 * | 1/2017 | Kamada | G01R 33/482 |
| 2014/0197835 A1 * | 7/2014 | Kamada | G01R 33/5608 324/309 |
| 2021/0068700 A1 * | 3/2021 | Shirai | G01R 33/246 |
| 2024/0118356 A1 * | 4/2024 | Zhao | A61B 5/055 |

FOREIGN PATENT DOCUMENTS

| | | |
|---|---|---|
| JP | 2018-68954 A | 5/2018 |
| JP | 2019-76441 A | 5/2019 |

* cited by examiner

*Primary Examiner* — Shaghayegh Azima

(57) ABSTRACT

Provided are an apparatus and a method for appropriately correcting a sensitivity of a composite image obtained by HiMAR imaging in which a plurality of times of imaging are performed with different frequency bands. An image processing unit of an MRI apparatus includes a sensitivity correction unit that performs sensitivity correction on a composite image obtained by HiMAR imaging. The sensitivity correction unit separates sensitivity data for each bin from image data for each bin, and combines the sensitivity data for each bin to obtain a sensitivity distribution. The sensitivity distribution for each bin is obtained by dividing an image in which the sensitivity distributions of the respective channels are combined, by an image in which the sensitivity distributions do not exist. The composite image of all bins is corrected by using this composite sensitivity distribution.

10 Claims, 11 Drawing Sheets

SENSITIVITY IMAGE 620

MAIN IMAGE 630

MAGNETIC RESONANCE IMAGING APPARATUS AND IMAGE PROCESSING METHOD

CROSS-REFERENCE TO RELATED APPLICATION

The present application claims priority from Japanese Patent Application No. 2023-103642 filed on Jun. 23, 2023, the content of which is hereby incorporated by reference into this application.

BACKGROUND OF THE INVENTION

1. Field of the Invention

The present invention relates to a magnetic resonance imaging apparatus, and more particularly, to a technique of performing sensitivity correction on a plurality of images acquired by using high-frequency magnetic field pulses in different frequency bands (bins).

2. Description of the Related Art

A magnetic resonance imaging apparatus (hereinafter, referred to as an MRI apparatus) irradiates a subject placed in a strong static magnetic field with a high-frequency magnetic field in a predetermined band having a resonance frequency of an examination target as a center frequency, collects a nuclear magnetic resonance signal generated from the examination target, and reconstructs a subject image. In such an MRI, in a case in which a metal exists inside the subject, the metal is magnetized by a static magnetic field, a magnetic field is generated around the metal, and the distortion of the magnetic field occurs, which deteriorates an image quality.

Therefore, the metal has been contraindicated in the MRI examination, but a technique of avoiding the metal artifact has been proposed (for example, U.S. Pat. No. 7,821,264B). In this technique, a plurality of 3D images (referred to as bin images) in which the frequency bands (bins) for the irradiation and the reception of the high-frequency magnetic field are different from each other are acquired, and the bin images are combined. Since the distortion of the magnetic field due to the metal mainly occurs in a frequency direction and a slice direction, the distortions in the frequency direction and the slice direction can be reduced by adopting this method.

In addition, various techniques have been proposed, including a technique in which the technique disclosed in U.S. Pat. No. 7,821,264B is improved (for example, JP2018-68954A and JP2019-76441A). Since these techniques are techniques of reducing a metal artifact, the techniques are referred to as high quality metal artifact reduction (HiMAR) imaging.

Meanwhile, in the MRI apparatus, in general, an image reconstructed by using a sensitivity distribution of a reception coil is corrected. As the sensitivity distribution, data obtained by measuring the sensitivity distribution of the reception coil used for the imaging in advance may be used, or image reconstruction data obtained by imaging the subject may be used to calculate the sensitivity distribution and to use this sensitivity distribution for the sensitivity correction (self-calibration).

SUMMARY OF THE INVENTION

It is desired to perform the sensitivity correction on the image obtained by the HiMAR imaging, but the image obtained by the HiMAR imaging is a composite image of the plurality of images obtained at different frequencies, so that the method of the sensitivity correction in the related art cannot be directly applied. For example, individual image data obtained in a plurality of bins is an image including the distortion, and thus the sensitivity correction cannot be accurately performed even by using the sensitivity distribution calculated from the image. In addition, the sensitivity distribution of the reception coil measured in advance is a sensitivity distribution measured under one frequency condition, and accurate correction is not always performed even in a case in which the sensitivity distribution is applied to the sensitivity correction of the composite image.

An object of the present invention is to provide a method of sensitivity correction that can be applied to a composite image of all bins obtained by HiMAR imaging.

An aspect of the present invention relates to an MRI apparatus comprising a unit (composite sensitivity distribution calculation unit) that calculates a sensitivity distribution for correcting a composite image of the HiMAR imaging, as a function of a processing unit that processes an MR image. The composite sensitivity distribution calculation unit calculates the sensitivity distribution for each bin from the image data measured with different frequency bands, and combines the sensitivity distribution for each bin to obtain the sensitivity distribution for the sensitivity correction. The composite image is corrected by using this composite sensitivity distribution. In a case in which a plurality of reception coils are provided, a multi-channel composite sensitivity distribution obtained for each reception coil is further combined to obtain a composite sensitivity distribution for the sensitivity correction.

That is, an aspect of the present invention relates to an MRI apparatus comprising: an imaging unit that uses a plurality of high-frequency magnetic field pulses having different frequency bands (bins) to measure a nuclear magnetic resonance signal for each bin; an image reconstruction unit that uses the nuclear magnetic resonance signal collected for each bin to reconstruct a plurality of subject images; an image combining unit that combines the plurality of subject images; and a sensitivity correction unit that performs sensitivity correction of the combined subject image. The sensitivity correction unit includes a sensitivity distribution combining unit combining sensitivity correction data acquired by the imaging unit for each bin to generate a composite sensitivity distribution, and uses the composite sensitivity distribution to perform the sensitivity correction of the combined subject image.

Another aspect of the present invention relates to an image processing method of using a plurality of high-frequency magnetic field pulses having different frequency bands (bins) to measure a nuclear magnetic resonance signal for each bin, and processing a plurality of subject images reconstructed by using the nuclear magnetic resonance signal collected for each bin, the image processing method comprising: a step of using the nuclear magnetic resonance signal measured for each bin to obtain a sensitivity distribution of a reception coil that receives the nuclear magnetic resonance signal, and combining the sensitivity distributions of the respective bins; a step of combining the plurality of subject images; and a step of using a composite sensitivity distribution obtained by combining the sensitivity distributions of the respective bins, to correct the combined subject image.

It should be noted that, in the present specification, the "data" includes both the measurement data (k-space data) consisting of the nuclear magnetic resonance signal collected by the imaging unit and the data (image data) obtained by converting the measurement data into data in a spatial domain, and among the data, the measurement data used for the sensitivity correction will be referred to as sensitivity correction data, and the image data used for the sensitivity correction will be referred to as sensitivity distribution data. In addition, the measurement data for reconstructing the image of the subject will be referred to as image reconstruction data or the reconstruction data, and the image data will be referred to as main image data, in order to distinguish the measurement data from the data used for the sensitivity correction.

According to the present invention, it is possible to effectively perform the sensitivity correction on the composite image of the HiMAR imaging, for which the sensitivity correction has been difficult in the related art.

DESCRIPTION OF THE PREFERRED EMBODIMENTS

Hereinafter, embodiments of an MRI apparatus according to the present invention will be described with reference to the drawings.

Figure 1:
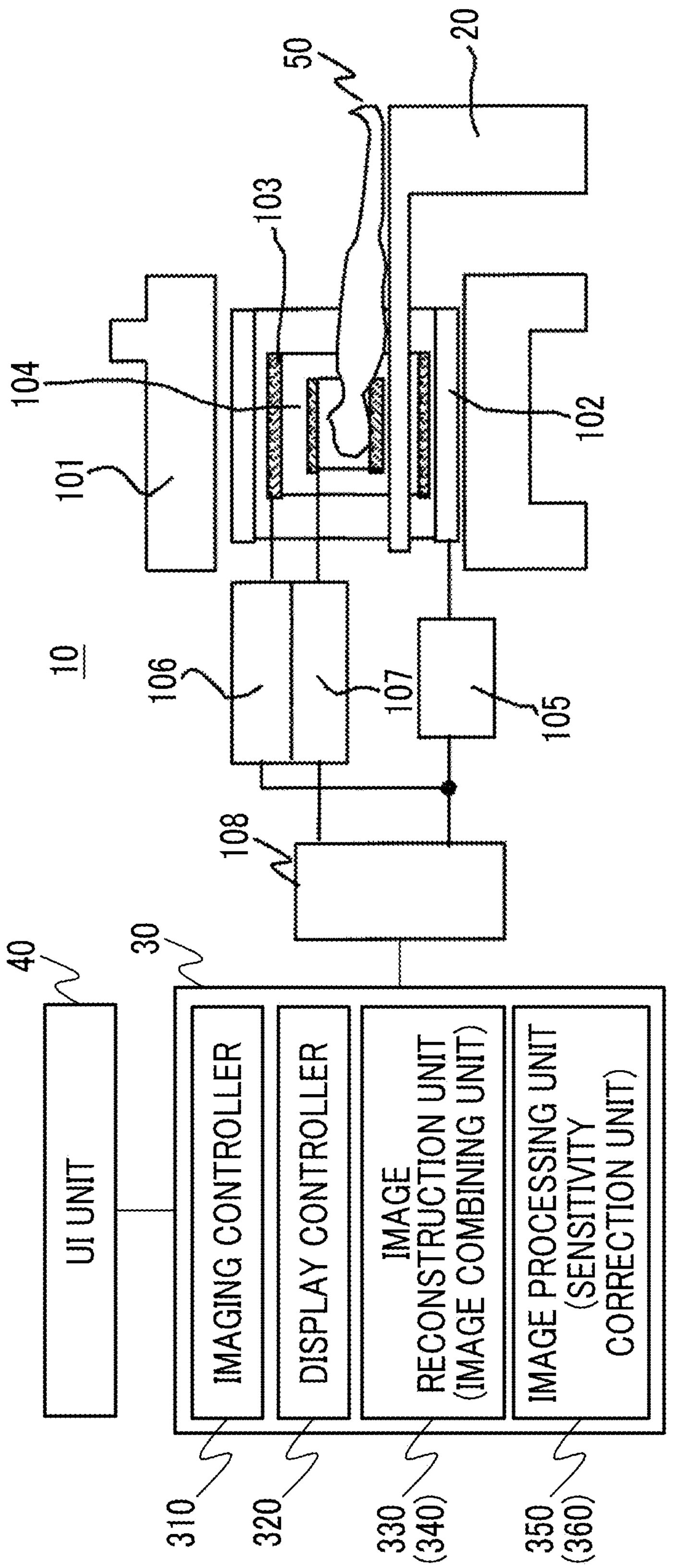
FIG. 1 is an overall configuration diagram of an MRI apparatus to which the present invention is applied.

The present invention is characterized in that image processing of the MRI apparatus, particularly sensitivity distribution correction is performed, and the present invention can be applied to a known MRI apparatus except for an image processing function. FIG. 1 shows a configuration of the MRI apparatus to which the present invention is applied.

As shown in FIG. 1, the MRI apparatus 1 comprises an imaging unit 10 that irradiates a subject 50 disposed in a static magnetic field space with a high-frequency magnetic field pulse and collects a nuclear magnetic resonance signal generated from the subject to acquire image reconstruction data of the subject, and an operation unit 30 that performs an operation of reconstructing a subject image, processing a reconstructed image, and the like by controlling the imaging unit 10 and using the nuclear magnetic resonance signal collected by the imaging unit 10. A user interface (UI) unit 40 that presents information to a user and receives a command from the user is connected to the operation unit 30.

The configuration of the imaging unit 10 is the same as that of a general MRI apparatus, and comprises a static magnetic field magnet 101, a gradient magnetic field coil 102 in three-axial directions, a gradient magnetic field power supply 105, an RF transmission coil 103, a transmitter 106, an RF reception coil 104, a receiver 107, and the like, and further comprises a sequencer 108 that operates the gradient magnetic field power supply 105, the transmitter 106, and the receiver 107 in accordance with a predetermined pulse sequence. Examples of the RF reception coil 104 include a body coil that covers a wide region and a surface coil that covers a part (part as an examination target) of the subject, and a reception sensitivity distribution varies depending on the type thereof. In order to obtain a uniform sensitivity distribution, a multi-channel coil in which a plurality of small coils are arranged is generally used, and the multi-channel coil is also used as an example in the present embodiment, but the present invention is not limited to this.

In general, the imaging is performed in a state in which the subject 50 is laid on a bed device 20 and is positioned in the imaging space such that the examination part is located at the center of the static magnetic field space (imaging space) in which the static magnetic field magnet 101 is generated. The imaging is performed by detecting, via the RF reception coil 104, the nuclear magnetic resonance signal generated from the subject 50 by irradiating the RF transmission coil 103, and in this case, the positional information is assigned to the nuclear magnetic resonance signal by driving the gradient magnetic field coil 102 of each axis to apply the gradient magnetic field, and the necessary number of nuclear magnetic resonance signals are collected for the image reconstruction.

The imaging (measurement) performed by the imaging unit 10 includes, in addition to the imaging (main imaging) for obtaining a diagnostic image of the subject, imaging for positioning, pre-scanning for collecting data for apparatus calibration, and the like.

The operation of the imaging unit 10 is performed based on an imaging sequence calculated by the sequencer 108 using an imaging condition set by the user and the predetermined pulse sequence. In the present invention, a plurality of times of imaging are performed by varying a frequency band (bin) of the high-frequency magnetic field pulse through the RF transmission coil 103. The pulse sequence used for the imaging is not particularly limited, but a fast 3D pulse sequence of an FSE system is usually used because a plurality of times of imaging are performed. The number of times of imaging, that is, the number of bins or the value of the frequency band is set in advance as standard values, and the sequencer 108 controls the frequency bands of the transmitter 106 and the receiver 107 in accordance with the setting thereof, and HiMAR imaging is performed.

The operation unit 30 can be configured by a general-purpose computer comprising a CPU and a memory, and as shown in FIG. 1, comprises an imaging controller 310 that controls the operation of the imaging unit 10 via the sequencer 108, a display controller 320 that controls the display of a display unit of the UI unit 40, an image reconstruction unit 330 that reconstructs the nuclear magnetic resonance signal (k-space data) collected by the imaging unit 10, and an image processing unit 350 that processes the reconstructed image. The function of each unit constituting the operation unit 30 is realized by the CPU reading a pre-designed program. Some functions of the operation unit 30 can also be performed by a programmable IC such as an ASIC or an FPGA, and can also be realized by an apparatus (including a cloud) different from the MRI apparatus. Here, the case including those cases will be referred to as the functions of the operation unit 30.

The image reconstruction unit 330 performs the image reconstruction by performing FFT reconstruction, sequential operation reconstruction, parallel imaging (PI) operation, and the like. In a case of the HiMAR imaging, the image reconstruction unit 330 includes an image combining unit 340, and reconstructs each of the image reconstruction data obtained by a plurality of times of imaging, and then combines the image reconstruction images to generate one image data.

The image processing unit 350 performs correction using the sensitivity distribution of the RF reception coil 104 on the image generated by the image reconstruction unit 330. For a case of an image obtained by a general imaging sequence, a technique of the sensitivity correction using the sensitivity distribution of the RF reception coil 104 has been established, and various improvements have been made. However, in the HiMAR imaging, since the obtained image is a composite image of the bin images measured in various frequency bands, the sensitivity correction is not performed. The MRI apparatus according to the present embodiment is characterized in that a sensitivity correction unit 360 for the image obtained by the HiMAR imaging is provided as a function of the image processing unit.

Hereinafter, the embodiments of the operation unit 30 described above, particularly the image processing unit 350 and the sensitivity correction unit 360 will be described.

Embodiment 1

In order to perform the sensitivity correction on the image obtained by the HiMAR imaging, the sensitivity correction unit 360 according to the present embodiment acquires the sensitivity correction data for each bin, generates the sensitivity distribution data by converting the sensitivity correction data of each bin into an image, combines the sensitivity distribution data, and calculates the sensitivity distribution (composite sensitivity distribution) for the composite image.

Figure 2:
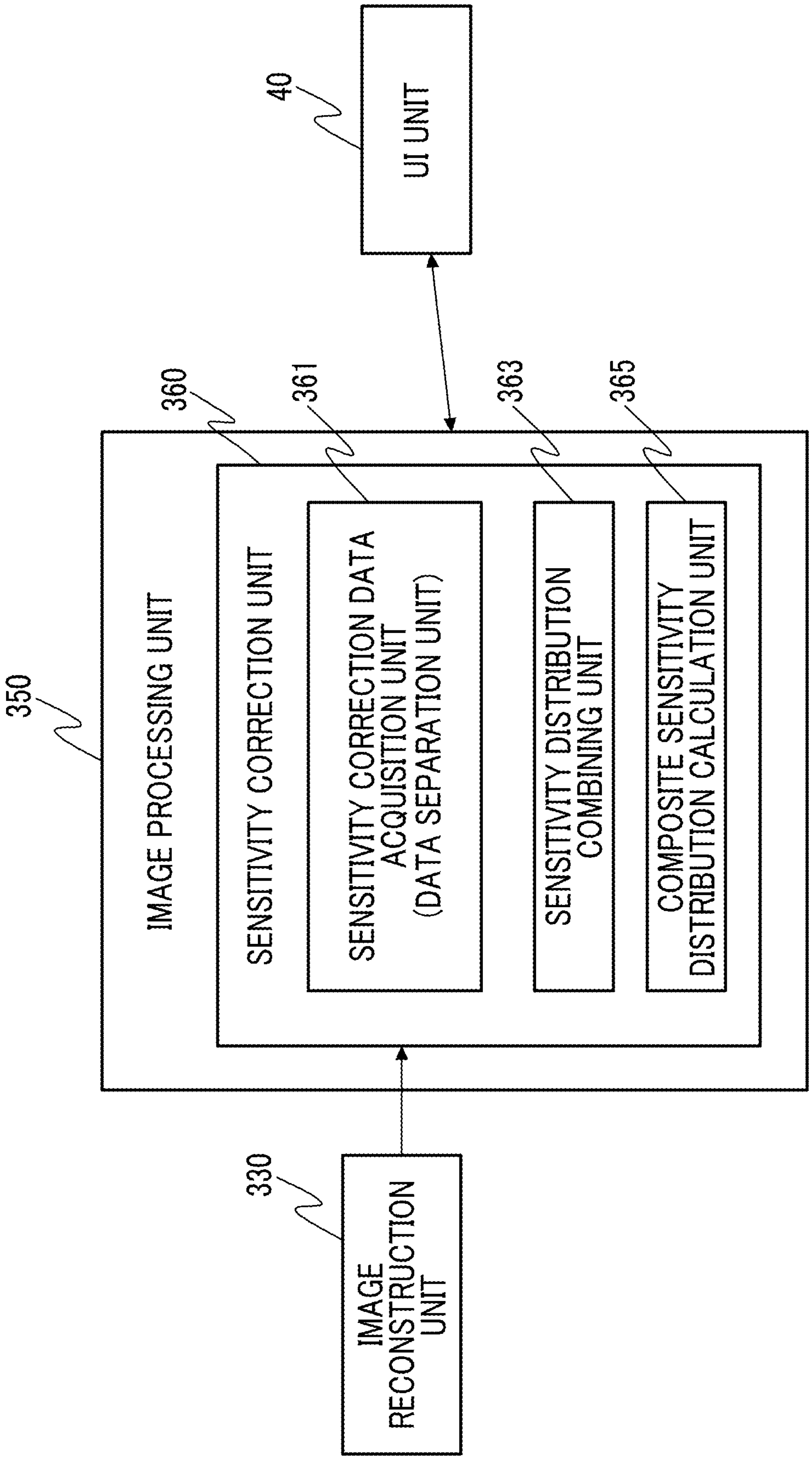
FIG. 2 is a functional block diagram of an image processing unit.

In order to realize these functions, as shown in FIG. 2, the sensitivity correction unit 360 according to the present embodiment comprises a sensitivity correction data acquisition unit 361, a sensitivity distribution combining unit 363, and a composite sensitivity distribution calculation unit 365. It should be noted that FIG. 2 is one configuration example of the sensitivity correction unit 360, and some elements shown in FIG. 2 may be omitted, the respective elements shown in FIG. 2 may be independent of each other, or another element may be included in one element.

The sensitivity correction data acquisition unit 361 acquires the measurement data consisting of the nuclear magnetic resonance signal collected by the imaging unit 10 as the sensitivity correction data. Here, the measurement data may be either the measurement data measured by the measurement for sensitivity correction or the measurement data (main measurement data) collected in the imaging of the subject, and in a case of the main measurement data, the sensitivity correction data acquisition unit 361 functions as a data separation unit that separates the sensitivity correction data from the main measurement data.

The sensitivity distribution combining unit 363 combines the sensitivity distribution data in which the sensitivity correction data is converted into the image. In a case in which the reception coil is the multi-channel coil and the measurement data is acquired for each channel, the sensitivity distribution data is combined by multi-channel combining.

The composite sensitivity distribution calculation unit 365 performs an operation of removing unnecessary components included in the combined sensitivity distribution data, and calculates the composite sensitivity distribution used for the sensitivity correction of a composite main image.

Figure 3:
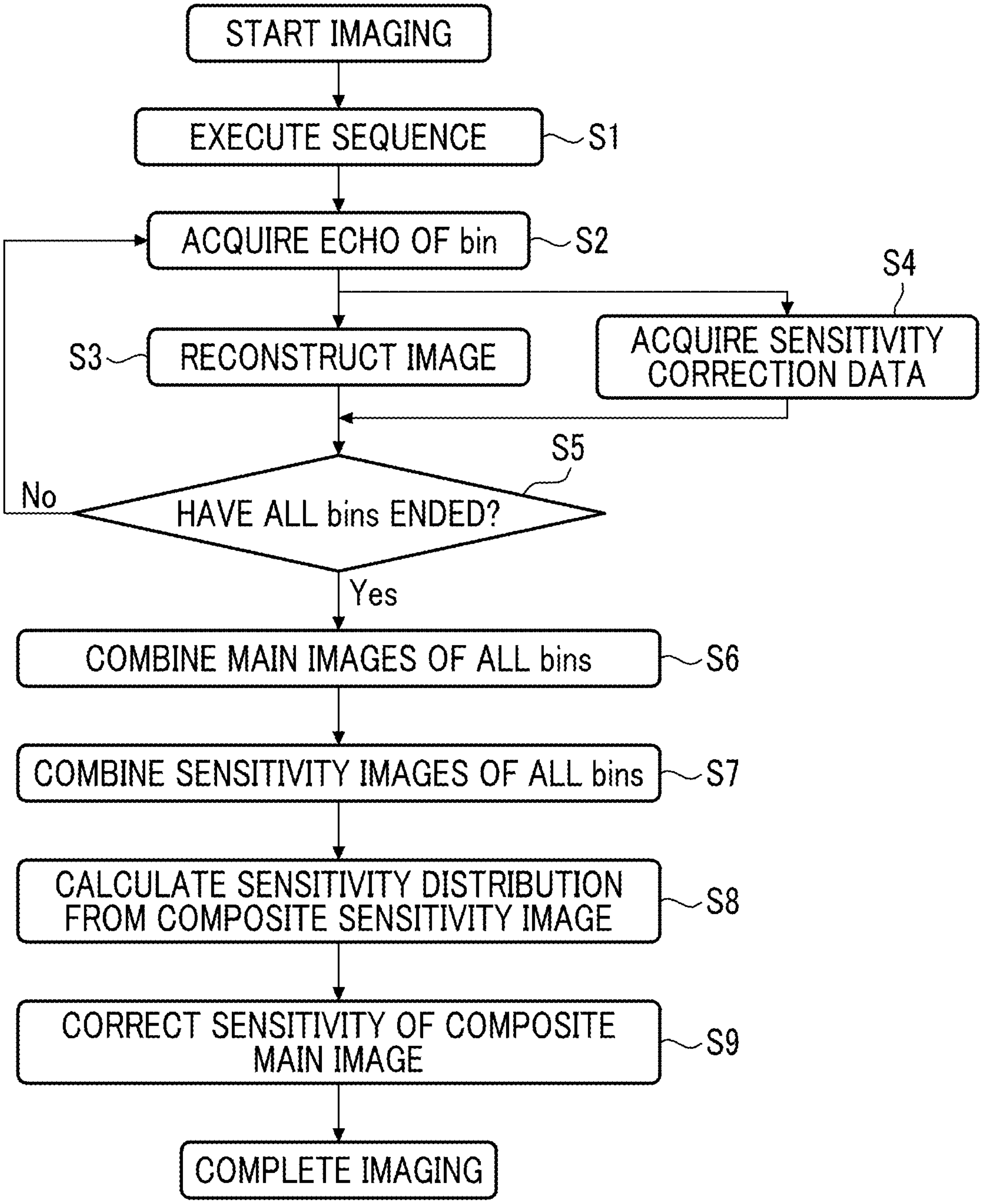
FIG. 3 is a flow showing an operation of an MRI apparatus according to Embodiment 1.

FIG. 3 shows a flow of image processing in the MRI apparatus having the above-described configuration.

First, the imaging unit 10 executes a 3D imaging sequence in a predetermined frequency band (bin) in accordance with the set imaging condition (S1), and acquires an echo signal of the bin (S2). In a case in which the echo signal (measurement data, which is 3D-k-space data) necessary for the image reconstruction is collected, the image reconstruction unit 330 reconstructs the subject image by using the measurement data (S3). In addition, in a case of the self-calibration, the sensitivity correction data acquisition unit 361 (data separation unit) separates and acquires the sensitivity correction data from the measurement data (S4). In a case in which the sensitivity correction data is acquired in the pre-scanning, the sensitivity correction data is acquired by separately executing steps S1 and S2.

In a case in which the imaging of all bins ends (S5), the image combining unit 340 combines the subject images of the respective bins to generate the composite main image (S6). On the other hand, the sensitivity distribution combining unit 363 combines the sensitivity correction data for each bin acquired in step S4 or the sensitivity distribution data (also referred to as the sensitivity image) obtained by converting the sensitivity correction data into the image, to generate composite sensitivity distribution data (composite sensitivity image) (S7). Since the subject information or the noise is convoluted with the sensitivity distribution in the composite sensitivity image, the composite sensitivity distribution calculation unit 365 performs an operation of extracting only the sensitivity distribution (S8). Finally, the sensitivity correction of the composite main image is performed by using the sensitivity distribution calculated last time, that is, the composite sensitivity distribution (S9).

According to the present embodiment, the sensitivity correction data is acquired for each bin, and the sensitivity distribution in which the sensitivity distributions of all bins are combined is generated by using the sensitivity correction data, so that it is possible to perform effective sensitivity correction for the composite main image obtained by the HiMAR imaging. According to the present embodiment, by using the sensitivity distribution data obtained by combining the sensitivity distribution data for each bin, for example, it is possible to perform the sensitivity correction with high accuracy without accumulation of errors in the sensitivity correction that may occur in the sensitivity correction for each image for each bin.

Embodiment 2

In the present embodiment, based on Embodiment 1, the HiMAR imaging is performed by using a plurality of reception coils (multi-channel coils) having different sensitivity distributions, and the sensitivity correction of the composite main image of all bins is performed by using sensitivity distribution information of each channel.

Since the configuration of the apparatus shown in FIGS. 1 and 2 is common to Embodiment 1, the description will be made below with reference to these drawings as appropriate.

In addition, in the imaging using the multi-channel reception coil, in general, the reconstruction is performed by performing the measurement by thinning out the phase encoding, and reconstructing the image by the PI operation or the like. Therefore, here, a case of performing the parallel imaging (PI) reconstruction will be described as an example.

Figure 4:
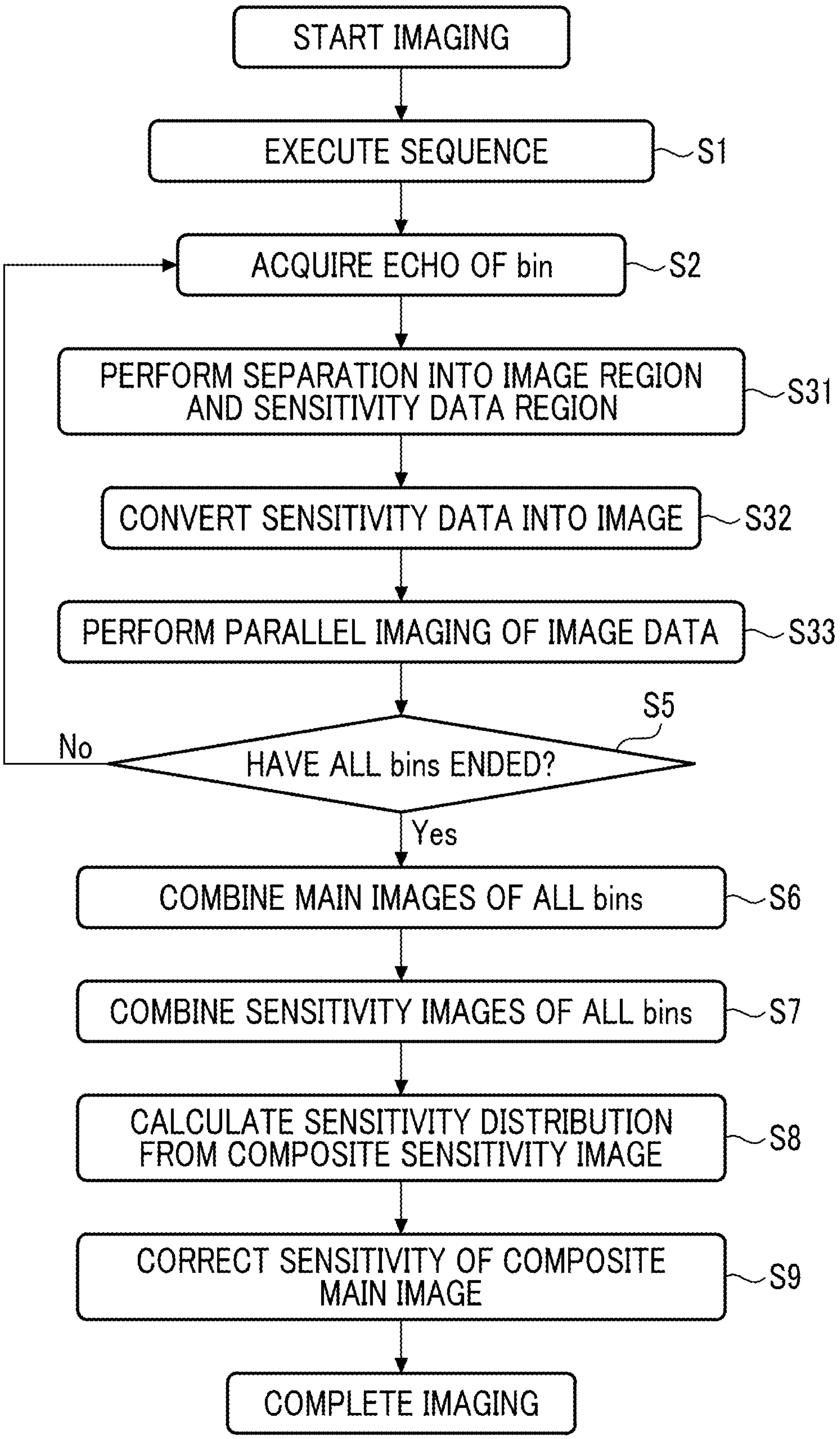
FIG. 4 is a flow showing an operation of an MRI apparatus according to Embodiment 2.

FIG. 4 shows a flow of processing according to the present embodiment. In FIG. 4, the same processing (step) as in FIG. 3 is denoted by the same reference numeral.

The imaging unit 10 executes the 3D imaging sequence in the predetermined frequency band (bin) in accordance with the set imaging condition (S1), and acquires the echo signal of the bin (S2). Here, since the PI reconstruction is premised, the echo signal is acquired by thinning out the k-space.

Next, the sensitivity correction data of each channel (hereinafter, simply referred to as sensitivity data) is acquired (S31). Although the sensitivity data may be data acquired by performing the pre-scanning separately from the main imaging to acquire the data in the low frequency region of the k-space, or may be the sensitivity data acquired by being separated from the echo signal (reconstruction data) obtained in the main imaging (self-calibration), the self-calibration is performed, whereby time for the pre-scanning is unnecessary, and it is possible to avoid an increase in the imaging time. In particular, in the HiMAR imaging, since the bin is different for each imaging, the sensitivity data in the same frequency band can be collected by performing the self-calibration.

It should be noted that, in a case in which the self-calibration is adopted as the method of acquiring the sensitivity distribution, it is preferable to acquire the data (full sampling) without thinning out in a low frequency region of the k-space. The data in the low frequency region that is fully sampled is separated from the echo data collected in step S2, and is used as the sensitivity data.

Figure 5A:
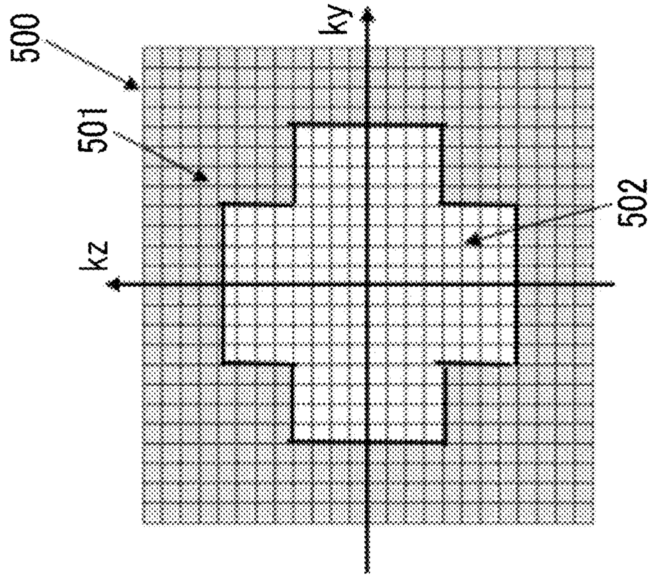
FIGS. 5A to 5C are diagrams showing separation of 3D image data obtained by HiMAR imaging and sensitivity distribution data.
Figure 5B:
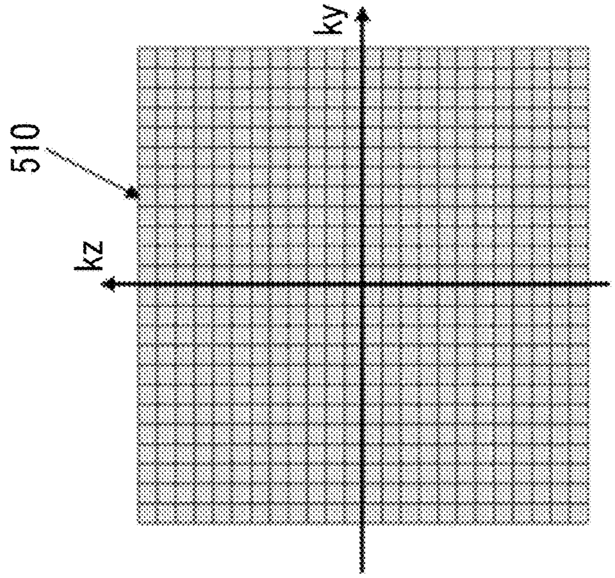
Figure 5C:
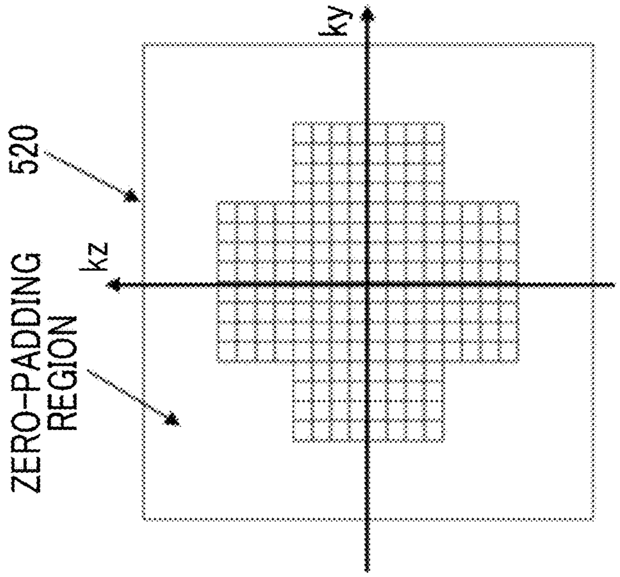

FIGS. 5A to 5C show examples of extracting the sensitivity data from the reconstruction data obtained in step S2. FIG. 5A shows measurement data 500. The measurement data 500 is 3D-k-space data. In the measurement data 500, a gray portion is a region (undersampling data region) 501 in which the phase encoding is thinned out, a white portion is a region 502, which is a full-sampling data region, for extracting the sensitivity data.

The sensitivity correction data acquisition unit (data separation unit) 361 adds a portion thinned out at the same thinning-out rate (R factor) as the region 501 in the full-sampling data region 502 to the undersampling data region 501 to obtain data thinned out at a uniform thinning-out rate over the entire k-space, and this data is used as reconstruction data 510 shown in FIG. 5B. As a result, it is easy to perform the general PI operation applied to the reconstruction. In addition, the full-sampling data region 502 and a region in which zero-padding is performed on a peripheral region thereof, that is, a region corresponding to the region 502 are used as sensitivity correction data (sensitivity data) 520 shown in FIG. 5C.

It should be noted that, in FIGS. 5A to 5C, as the region 502 from which the sensitivity data is extracted, a shape in which two rectangles are crossed is shown, but the shape of the region to be extracted is any shape such as a circular shape or an elliptical shape as long as the region includes the central portion of the kykz space.

Next, the sensitivity data obtained by the self-calibration is converted into the image to obtain the sensitivity distribution (sensitivity map) (S32). In this case, filtering processing of removing the subject information convoluted with the sensitivity data, processing of extracting only the sensitivity distribution using a reference image generated from the echo signal received by the body coil or the like, or the like may be performed.

Next, the image is reconstructed by the parallel imaging (PI) operation using the sensitivity distribution of each channel obtained in step S32 (S33). The parallel imaging operation includes an operation on the k-space (GRAPPA method, CAIPIRINHA method, or the like) and an operation on a real space (SENSE method or the like), and any of these operations may be adopted. However, in the flow shown in FIG. 4, the PI operation of expanding the generated turn of the image data obtained by reconstructing the echo signal obtained in step S2 and the sensitivity distribution converted into the image in a real space is performed.

Figure 6:
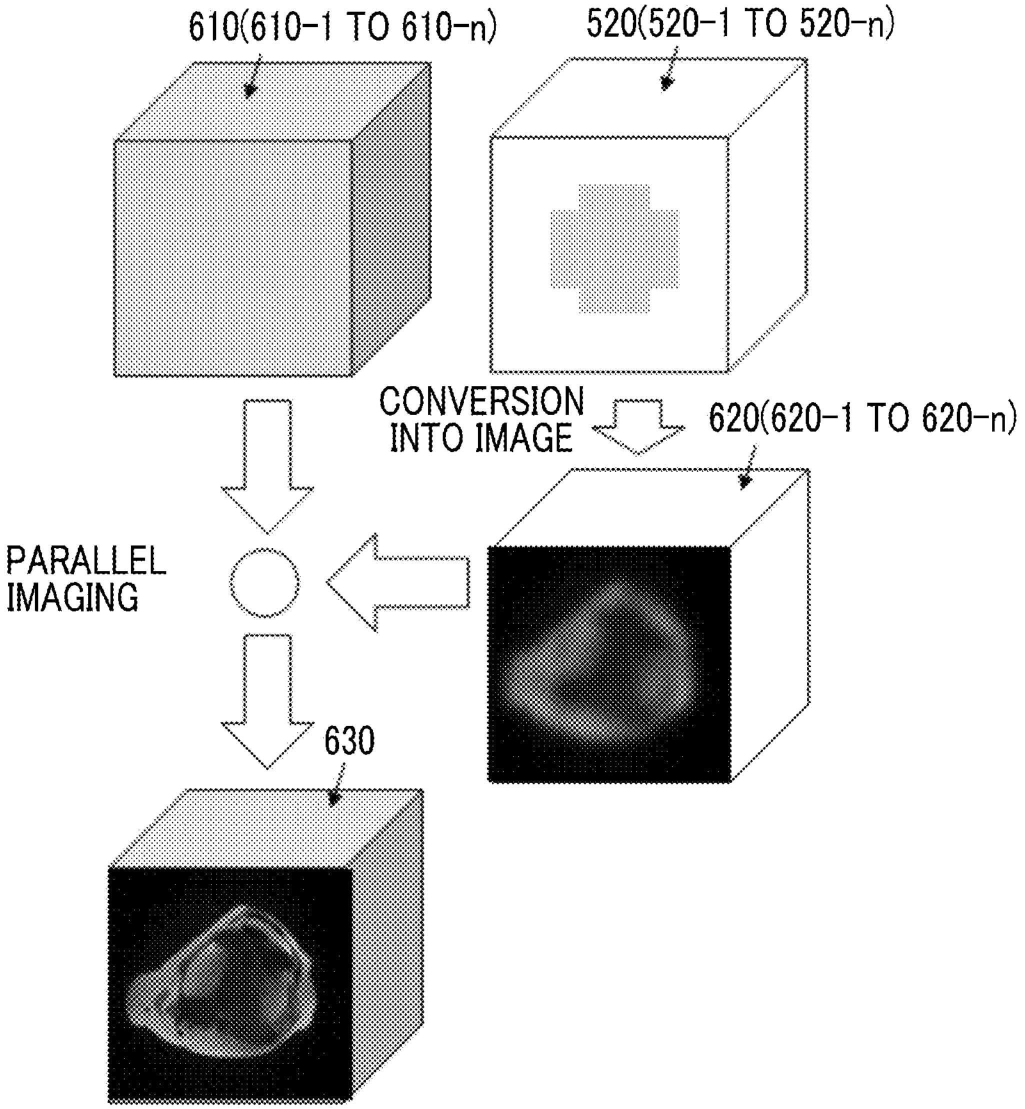
FIG. 6 is a diagram showing parallel imaging of image data.

FIG. 6 shows an outline of the PI operation using the 3D data. In this example, as shown in FIGS. 5A to 5C, the PI operation is performed by using image data 610 obtained from the separated reconstruction data 510 and a sensitivity image 620 obtained by converting the sensitivity data 520 into the real space data by the 3D-FFT or the like, to generate a main image (3D-image data) 630. It should be noted that, in FIG. 6, the reconstruction (image) data 610, the sensitivity data 520, and the sensitivity image 620 are shown as one each for simplicity of the illustration, but the data and the image are obtained in the same number as the number of channels n, and one main image 630 is obtained by performing an operation between pieces of the data or the images corresponding to the number of channels.

The echo acquisition of the bin (S2) to the PI operation (S31 to S33) are repeated (S5) by changing the high-frequency frequency band of the transmission and the reception. Finally, the images corresponding to the number of bins set as the imaging condition are obtained, and the images of all bins are combined to obtain the image of the main imaging (S6). As a method of combining the images in the HiMAR imaging, a maximum intensity projection (MIP) represented by Expression (1), a sum of square (SOS) represented by Expression (2), or an improved method (weighting combination) described in U.S. Pat. No. 7,821,264B are known, and any method may be employed.

$$SynthImage(x, y, z) = \max_n[\mathrm{Image}(x, y, z, n)] \tag{1}$$

$$SynthImage(x, y, z) = \sqrt{\frac{1}{N}\sum_{n=1}^{N}\mathrm{Image}(x, y, z, n)^2} \tag{2}$$

Here, x, y, z are coordinates in respective directions, N is the number of acquired images, n is an image number (1 to N), Image( ) is a pixel value (before combining) of a pixel of the coordinate in (SynthImage( ) is a pixel value (after combining) of a pixel of the coordinate in ( ), $$\max_n[\ ]$$

is an operator indicting the maximum value of a pixel of the coordinate in [ ] in case in which a=1 to N.

Figure 7:
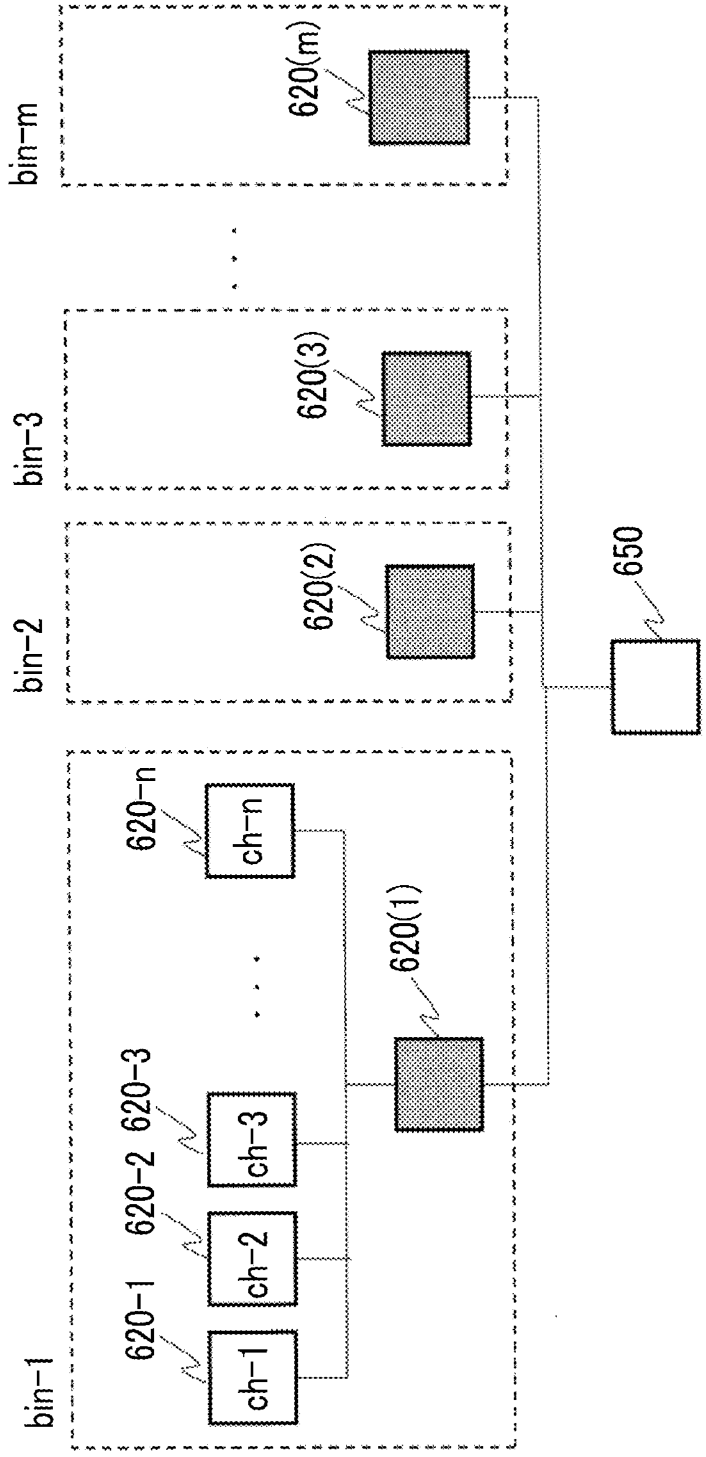
FIG. 7 is a diagram showing sensitivity data for each bin and for each channel.

On the other hand, the sensitivity correction unit 360 combines the sensitivity distribution for each bin obtained in step S32 to obtain the composite sensitivity distribution of all bins (S7). In step S32, as represented by "bin-1" on the right side of FIG. 7, since the sensitivity images 620-1 to **620-*n* (n is the number of channels) for each channel are obtained for each bin, the sensitivity images for each channel are first combined to obtain one sensitivity image (sensitivity distribution) 620 (620(1) to 620**(*m*) (m is the number of bins)) for one bin image. Next, the sensitivity distributions 620(1) to 620(*m*) for each bin are combined to obtain a composite sensitivity distribution (composite sensitivity distribution image) 650 of all bins. The sensitivity distribution can also be combined by the same method as in the combination of the main images, for example, by using MIP or SOS. It should be noted that, in FIG. 7, for the convenience of the drawing, the sensitivity image is shown in 2D, but the sensitivity image is 3D data.

Figure 8:
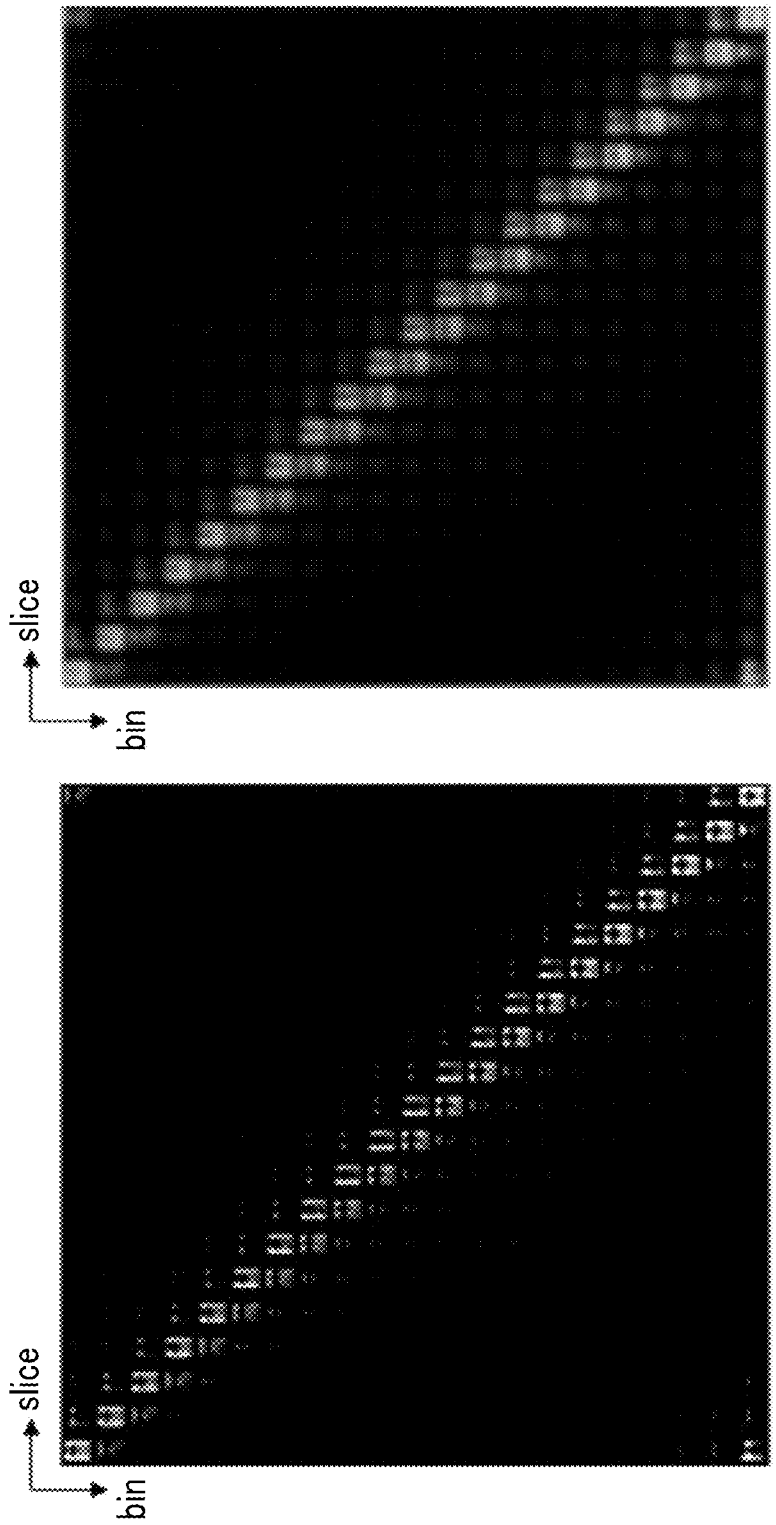
FIG. 8 is a diagram showing a main image and a sensitivity image of each bin before being combined.

FIG. 8 is a diagram showing the main image and the sensitivity image of each bin before being combined. As shown in FIG. 8, these pieces of data are a set of the image data in which the bins are shifted in the slice direction, and by combining the data by the above-described method, all pieces of the data are images in which the distortions in the slice direction and in the frequency direction are corrected.

Next, the sensitivity correction of the composite main image is performed. However, in the composite sensitivity image obtained in step S7, the subject information or the noise is convoluted with the original sensitivity distribution. Therefore, in the present embodiment, processing of removing the information other than the sensitivity distribution via the operation is performed to calculate only the sensitivity distribution (S8).

Figure 9:
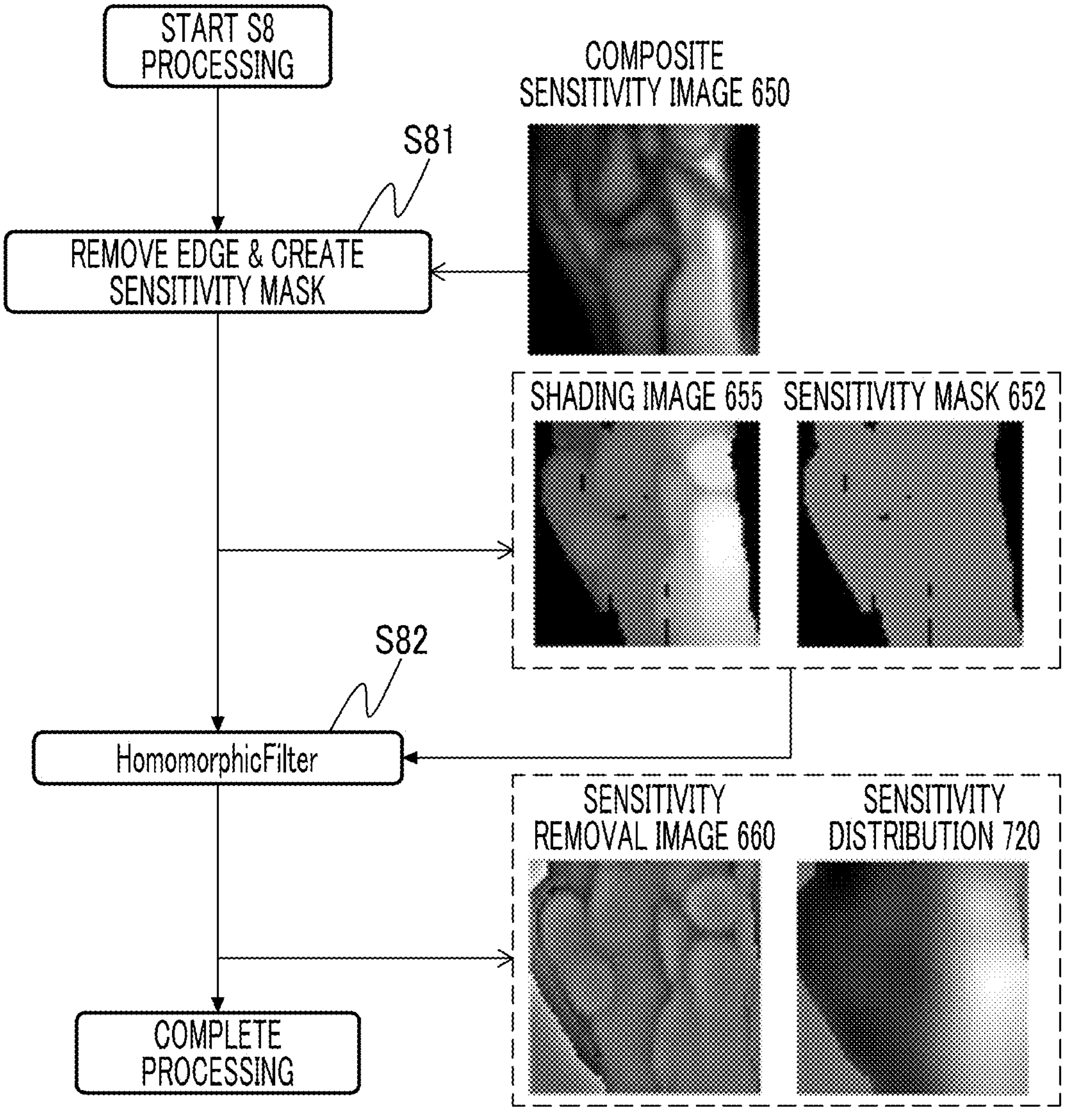
FIG. 9 is a diagram showing a flow of calculation of a sensitivity distribution.

A method of estimating the sensitivity distribution from which the subject information is removed with reference to FIG. 9 will be described. In this method, a method of performing the edge removal (S81), the processing (S82) using homomorphic filter, or the like on the composite sensitivity image 650, acquiring an image (sensitivity removal image) 660 from which the sensitivity is removed, and calculating a sensitivity distribution 720 by dividing the composite sensitivity image 650 by the sensitivity removal image 660 will be described. It should be noted that, in this method, the image data as the 3D data is processed as the 2D data for each slice, but the details of the processing for each slice will be omitted here.

Figure 10:
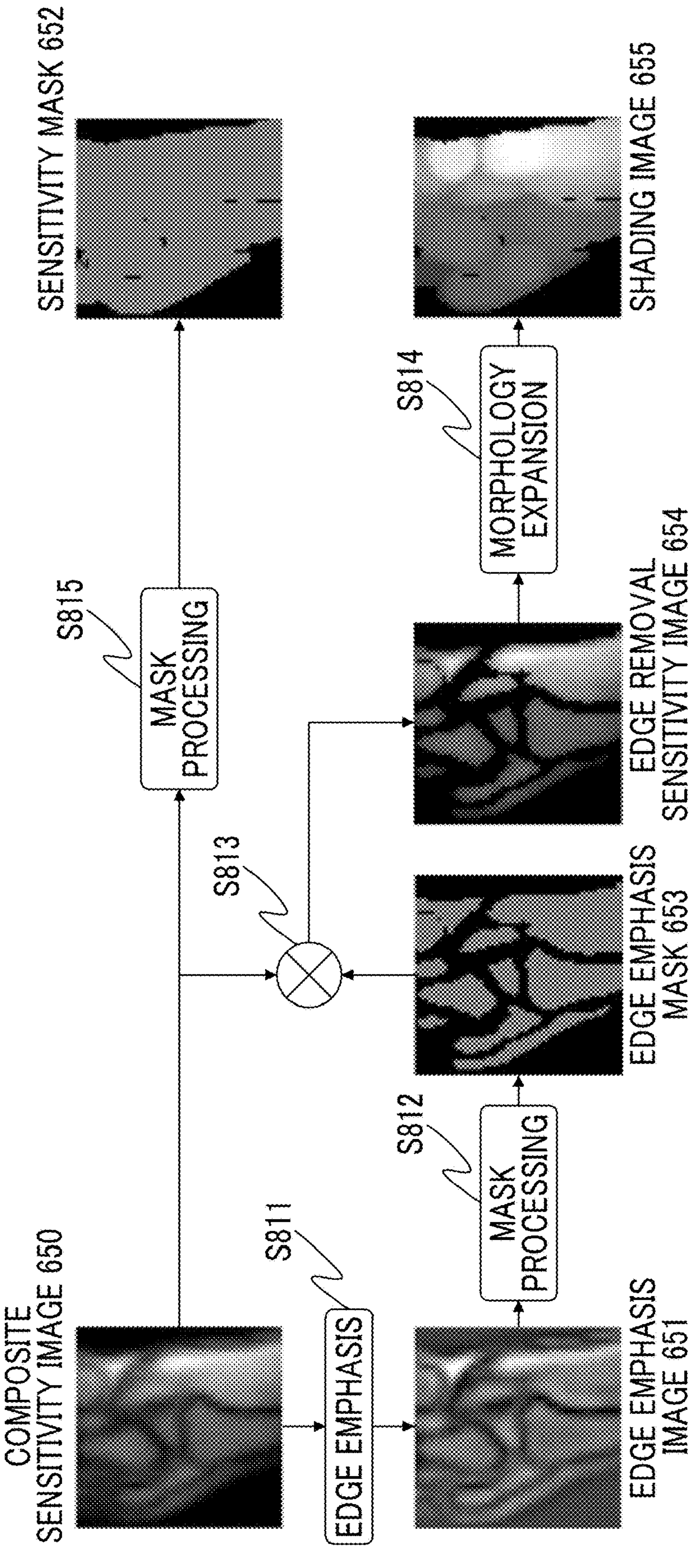
FIG. 10 is a diagram showing details of edge processing S81 of FIG. 9.

First, in edge removal processing S81, an image from which the edge is removed and a sensitivity mask are created. Specifically, as shown in FIG. 10, the edge emphasis is performed on the composite sensitivity image 650 to obtain an edge emphasis image 651 (S811). For the edge emphasis image 651, mask processing of dividing the region regarded as representing the shading and the other region is performed to obtain an edge emphasis mask 653 (S812). The edge emphasis mask 653 is applied to the composite sensitivity image 650 to obtain a sensitivity image (edge removal sensitivity image) 654 in which the edge is removed (S813). The edge removal sensitivity image 654 is an image showing the sensitivity of the region regarded as representing the shading. The edge removal sensitivity image 654 is further subjected to the morphology expansion to obtain a shading image 655 showing the sensitivity by expanding the region regarded as the shading (S814).

On the other hand, the composite sensitivity image 650 is subjected to the mask processing of dividing the composite sensitivity image 650 into a detailed tissue region and a noise region to generate a sensitivity mask 652 (S815).

Figure 11:
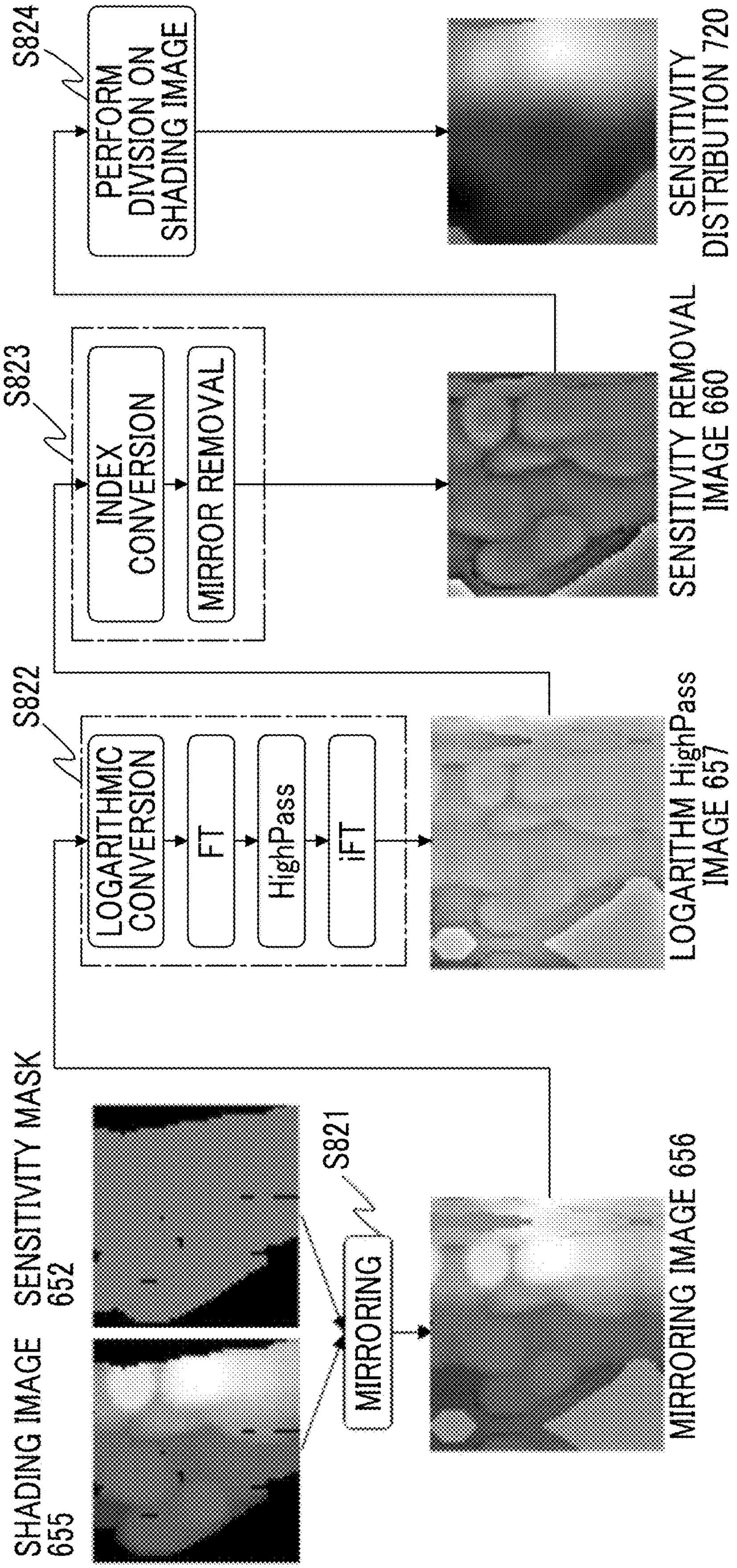
FIG. 11 is a diagram showing details of homomorphic filter processing S82 of FIG. 9.

The processing (S82) using the homomorphic filter or the like is processing of calculating the sensitivity removal image 660 from the shading image 655. Specifically, as shown in FIG. 11, the mirroring is performed by using the shading image 655 obtained in the edge processing (S814) and the sensitivity mask 652 generated in the mask processing (S815), to generate a mirroring image 656 (S821). The mirroring is processing for minimizing a step portion of a signal, and is particularly effective in a case in which a biological tissue region is in contact with the edge of the image. The mirroring image 656 is subjected to filtering (High Pass) in a frequency domain. In this case, the original image without the shading and the shading can be separated by performing the logarithmic conversion (S822). Thereafter, a logarithm High Pass image 657 is subjected to the index conversion and the mirror removal to obtain the sensitivity removal image 660 (S823).

Finally, the shading image 655 is divided by the sensitivity removal image 660 to obtain the sensitivity distribution 720 (S824). By using the above-described method, it is possible to obtain the sensitivity distribution with high accuracy.

As a method of estimating the sensitivity distribution from which the subject information is removed, in addition to the above-described method, a known method may be adopted, such as a method of using a reference image (for example, an image obtained by the body coil) that does not depend on the sensitivity distribution, or a method of obtaining the sensitivity by performing, in the k-space, deconvolution of the frequency component of the sensitivity distribution convoluted with the reference image in the k-space.

The sensitivity distribution 720 obtained in this way is used to perform the sensitivity correction of the composite main image by using Expression (3) (S10).

"Corrected image" = "composite main image"/"sensitivity distribution" (3)

According to the present embodiment, the sensitivity correction can be applied to the composite image (composite main image) obtained by combining each bin image obtained by the HiMAR imaging, and the image quality can be improved. By using the composite sensitivity distribution obtained by combining the sensitivity data of each bin as the sensitivity distribution used for the sensitivity correction, it is possible to realize good sensitivity correction without accumulation of sensitivity correction errors that would occur in a case of performing the sensitivity correction on each bin image.

Modification Example of Embodiment 2

In Embodiment 2, as the reconstruction of the main image (each bin image), the reconstruction using the parallel imaging operation has been described, but the reconstruction may be performed using sequential reconstruction represented by the compressed sensing, or the k-space may be fully sampled and the reconstruction of the multi-channel combination may be simply performed in a case in which there is no restriction on the imaging time.

In a case of the reconstruction without using the sensitivity distribution in the reconstruction of the main imaging, separately from the reconstruction of the main image, the sensitivity data of each channel is extracted for each bin to obtain the sensitivity image and to obtain the sensitivity distribution for each channel, and step S6 (combining the sensitivity images of all bins) and step S8 (calculating the sensitivity distribution) of FIG. 4 are performed after the multi-channel combining.

Although the embodiments of the present invention have been described above with reference to the apparatus using the multi-channel reception coil as a main example, the present invention can also be applied to HiMAR imaging in which a single reception coil is used without being limited to the multi-channel reception coil. In addition, the configurations of the operation unit and the image processing unit, the flow described in each embodiment, and the like are examples, and some elements and processing can be omitted for elements and processing that are not essential for the sensitivity correction.

EXPLANATION OF REFERENCES

10: imaging unit
30: operation unit
330: image reconstruction unit
340: image combining unit
350: image processing unit
360: sensitivity correction unit
361: sensitivity correction data acquisition unit (data separation unit)
363: sensitivity distribution combining unit
365: composite sensitivity distribution calculation unit

What is claimed is:

1. A magnetic resonance imaging apparatus comprising:
an imaging unit that uses a plurality of high-frequency magnetic field pulses having different frequency bands (bins) to measure a nuclear magnetic resonance signal for each bin; and
one or more processors configured to use the nuclear magnetic resonance signal collected for each bin to reconstruct a plurality of subject images, combine the plurality of subject images and perform sensitivity correction of the combined subject image,
wherein the one or more processors combine sensitivity correction data acquired by the imaging unit for each bin to generate a composite sensitivity distribution, and use the composite sensitivity distribution to perform the sensitivity correction of the combined subject image.

2. The magnetic resonance imaging apparatus according to claim 1,
wherein the one or more processors separate measurement data consisting of the nuclear magnetic resonance signal collected for each bin into reconstruction data of the subject image and the sensitivity correction data.

3. The magnetic resonance imaging apparatus according to claim 2,
wherein the measurement data includes a full-sampling data region and an undersampling data region, and
the one or more processors extract the full-sampling data region as the sensitivity correction data.

4. The magnetic resonance imaging apparatus according to claim 3,
wherein the one or more processors use data obtained by thinning out the full-sampling data region to have the same thinning-out rate as the undersampling data region along with the undersampling data region as the reconstruction data, to reconstruct the subject image.

5. The magnetic resonance imaging apparatus according to claim 1,
wherein the imaging unit includes a multi-channel reception coil as a reception coil receiving the nuclear magnetic resonance signal, and collects measurement data for each channel, and
the one or more processors combine the sensitivity correction data of a plurality of the channels for each bin to generate the sensitivity correction data for each bin.

6. The magnetic resonance imaging apparatus according to claim 5,
wherein the one or more processors perform image reconstruction based on an operation of a parallel imaging method using the sensitivity correction data for each channel for each bin.

7. The magnetic resonance imaging apparatus according to claim 1,
wherein the one or more processors use the nuclear magnetic resonance signal collected by the imaging unit for each bin via pre-scanning, as the sensitivity correction data.

8. An image processing method of using a plurality of high-frequency magnetic field pulses having different frequency bands (bins) to measure a nuclear magnetic resonance signal for each bin, and processing a plurality of subject images reconstructed by using the nuclear magnetic resonance signal collected for each bin, the image processing method comprising:
a step of using the nuclear magnetic resonance signal measured for each bin to obtain a sensitivity distribution of a reception coil that receives the nuclear magnetic resonance signal, and combining the sensitivity distributions of the respective bins;
a step of combining the plurality of subject images; and
a step of using a composite sensitivity distribution obtained by combining the sensitivity distributions of the respective bins, to correct the combined subject image.

9. The image processing method according to claim 8,
wherein the step of combining the sensitivity distributions of the respective bins includes a step of combining the nuclear magnetic resonance signals collected by a multi-channel reception coil to obtain a channel composite sensitivity distribution for each bin, and a step of combining channel composite sensitivities for each bin to calculate the composite sensitivity distribution.

10. The image processing method according to claim 8,
wherein the step of combining the sensitivity distributions of the respective bins includes
a step of using the nuclear magnetic resonance signal measured for each bin to generate sensitivity distribution data for each bin,
a step of combining the sensitivity distribution data for each bin to generate composite sensitivity distribution data,
a step of estimating a sensitivity removal image from the composite sensitivity distribution data, and
a step of using the composite sensitivity distribution data and the estimated sensitivity removal image to generate the composite sensitivity distribution.

* * * * *